(12) United States Patent
Chen et al.

(10) Patent No.: US 11,395,441 B2
(45) Date of Patent: Jul. 19, 2022

(54) SYSTEMS AND METHODS FOR OPERATING A FLAP

(71) Applicant: Quanta Computer Inc., Taoyuan (TW)

(72) Inventors: Chao-Jung Chen, Taoyuan (TW); Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 312 days.

(21) Appl. No.: 16/866,071

(22) Filed: May 4, 2020

(65) Prior Publication Data
US 2021/0298205 A1   Sep. 23, 2021

Related U.S. Application Data

(60) Provisional application No. 62/993,284, filed on Mar. 23, 2020.

(51) Int. Cl.
| | |
|---|---|
| *H05K 7/20* | (2006.01) |
| *G05G 5/06* | (2006.01) |
| *G06F 1/18* | (2006.01) |
| *H05K 7/14* | (2006.01) |
| *G06F 1/20* | (2006.01) |

(52) U.S. Cl.
CPC .......... *H05K 7/20709* (2013.01); *G05G 5/06* (2013.01); *G06F 1/182* (2013.01); *G06F 1/20* (2013.01); *H05K 7/1489* (2013.01); *G05G 2505/00* (2013.01); *G06F 2200/201* (2013.01)

(58) Field of Classification Search
CPC ........................................................ G06F 1/18
See application file for complete search history.

(56) References Cited

U.S. PATENT DOCUMENTS

| | | | |
|---|---|---|---|
| 2013/0342990 A1* | 12/2013 | Jau ............................ | G06F 1/18 361/679.39 |
| 2019/0098794 A1* | 3/2019 | Chen .................... | H05K 7/1461 |

\* cited by examiner

*Primary Examiner* — Jerry Wu
(74) *Attorney, Agent, or Firm* — Nixon Peabody LLP

(57) ABSTRACT

Systems and methods include a chassis having a slot configured to receive a module with a flap are disclosed. The flap is configured to be in at least a first position and a second position. The system further includes a push rod configured to translate within the slot. The push rod is configured in a first position to allow the flap to move to the first flap position, and in a second position to move the flap into the second flap position. The system further includes a latch configured to translate within the slot and engage the push rod to travel in a first direction with the push rod, from the first push rod position to the second push rod position. The latch is also configured to withdraw the push rod from the second push rod position in a second direction, opposite from the first direction.

16 Claims, 16 Drawing Sheets

SYSTEMS AND METHODS FOR OPERATING A FLAP

CROSS-REFERENCE TO RELATED APPLICATION

This application claims priority under 35 U.S.C. § 119 to U.S. Provisional Application No. 62/993,284, titled "AUTOLOCK DEVICE FOR FLAP PUSH ROD," and filed on Mar. 23, 2020. The contents of that application are hereby incorporated by reference in their entirety.

FIELD OF THE INVENTION

The present invention relates to systems and methods for opening and closing a flap that restricts or reduces air from entering or escaping a slot within a chassis, such as a computer chassis.

BACKGROUND

Computer chassis often have one or more slots that allow for the insertion and removal of modules. For example, servers—such as blade servers or similarly configured servers—include chassis with one or more slots that allow for the insertion and removal of modules, such as blade server modules. The slots often have flaps. In a closed position, the flaps can restrict or reduce airflow from escaping or entering the chassis through the slot. The flaps can move open upon inserting modules within the slots. For example, the action of inserting a module within a slot can cause the flap to move from a closed flap position to an open flap position, which allows the module to be fully inserted into the chassis with the slot, or allows the module to receive airflow from within the chassis.

However, issues can arise when the module is withdrawn from the slot. Specifically, the flap of a slot may not move back to the closed flap position after removal of the module. This can result in unwanted airflow entering or escaping the slot with the flap stuck in the open flap position.

Accordingly, there is a need for systems and methods that can assist in having a flap return to a closed flap position upon the withdrawal of a module from a slot. Aspects of the present disclosure solve this and other problems.

SUMMARY

According to one embodiment, a system is disclosed that includes a chassis having a slot configured to receive a module. The system further includes a flap within the slot. The flap is configured to be in at least a first flap position and a second flap position. The system further includes a push rod configured to translate within the slot. The push rod is configured in a first push rod position to allow the flap to move to the first flap position. The push rod is further configured in a second push rod position to move the flap into the second flap position. The system also includes a latch configured to translate within the slot. The latch is configured to engage the push rod to travel in a first direction with the push rod from the first push rod position to the second push rod position. The latch is further configured to withdraw the push rod from the second push rod position in a second direction, opposite from the first direction.

Aspects of the embodiment include the push rod being configured to translate within the slot between the first push rod position and the second push rod position based, at least in part, on withdrawal and insertion of the module within the slot. Aspects of the embodiment include the push rod being configured to translate within the slot between the first push rod position and the second push rod position based, at least in part, on the latch translating in response to the withdrawal and insertion of the module within the slot. Aspects of the embodiment include a notch in the push rod. The latch is configured to engage the push rod by engaging the notch. Aspects of the embodiment include a raised portion within the slot. The latch is configured to engage the notch of the push rod by overriding the raised portion in the slot as the latch translates in the first direction. Aspects of the embodiment include a raised portion within the slot. The latch is configured to disengage from the push rod by overriding the raised portion in the slot as the latch withdraws the push rod in the second direction. Aspects of the embodiment include the latch being connected to the module. Aspects of the embodiment include the latch being a leaf spring. Aspects of the embodiment include the push rod being connected to the chassis. Aspects of the embodiment include the chassis being a blade server chassis, with the blade server having a plurality of the slot. Aspects of the embodiment include the module being a blade server module.

According to another embodiment, a method is disclosed that includes the step of beginning to withdraw a module from within a slot of a chassis in a first direction. The method further includes the step of translating a latch within the slot in the first direction with the beginning of the withdrawal of the module from the slot. The method further includes the step of translating a push rod engaged with the latch in the first direction with the translating of the latch. The translating of the push rod allows a flap within the slot to begin moving from an open flap position to a closed flap position. The method further includes the step of advancing the latch over a raised portion within the slot causing the latch to disengage from the push rod with the flap substantially in the closed flap position.

Aspects of the embodiment include the raised portion being formed in the chassis. Aspects of the embodiment include the flap in the closed flap position restricting or reducing airflow from entering or escaping the slot. Aspects of the embodiment include the flap in the open flap position being configured to allow full insertion of the module within the slot. Aspects of the embodiment include the chassis being a blade server chassis, with the blade server having a plurality of the slot. Aspects of the embodiment include the latch being connected to the module, and the push rod being connected to the chassis.

According to one embodiment, a method is disclosed that includes the step of inserting a module within a slot of a chassis in a first direction. The method further includes the step of translating a latch in the slot in the first direction with the inserting of the module. The method further includes the step of overriding a portion of a push rod with the latch, causing the latch to engage a notch in the push rod. The method further includes the step of translating the push rod with the latch and the module within the slot in the first direction. The translating causes the push rod to move a flap within the slot from a closed flap position to an open flap position, which allows the module to be fully inserted in the slot.

Aspects of the embodiment include the latch being a leaf spring. Aspects of the embodiment include the flap in the open flap position being configured to allow full insertion of the module within the slot. The flap in the closed flap position restricts or reduces airflow from escaping the slot.

The above summary is not intended to represent each embodiment or every aspect of the present disclosure.

Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of embodiments together with reference to the accompanying drawings. These drawings depict only embodiments and are, therefore, not to be considered as limitations on the scope of the various embodiments or claims.

DETAILED DESCRIPTION

Figure 1:
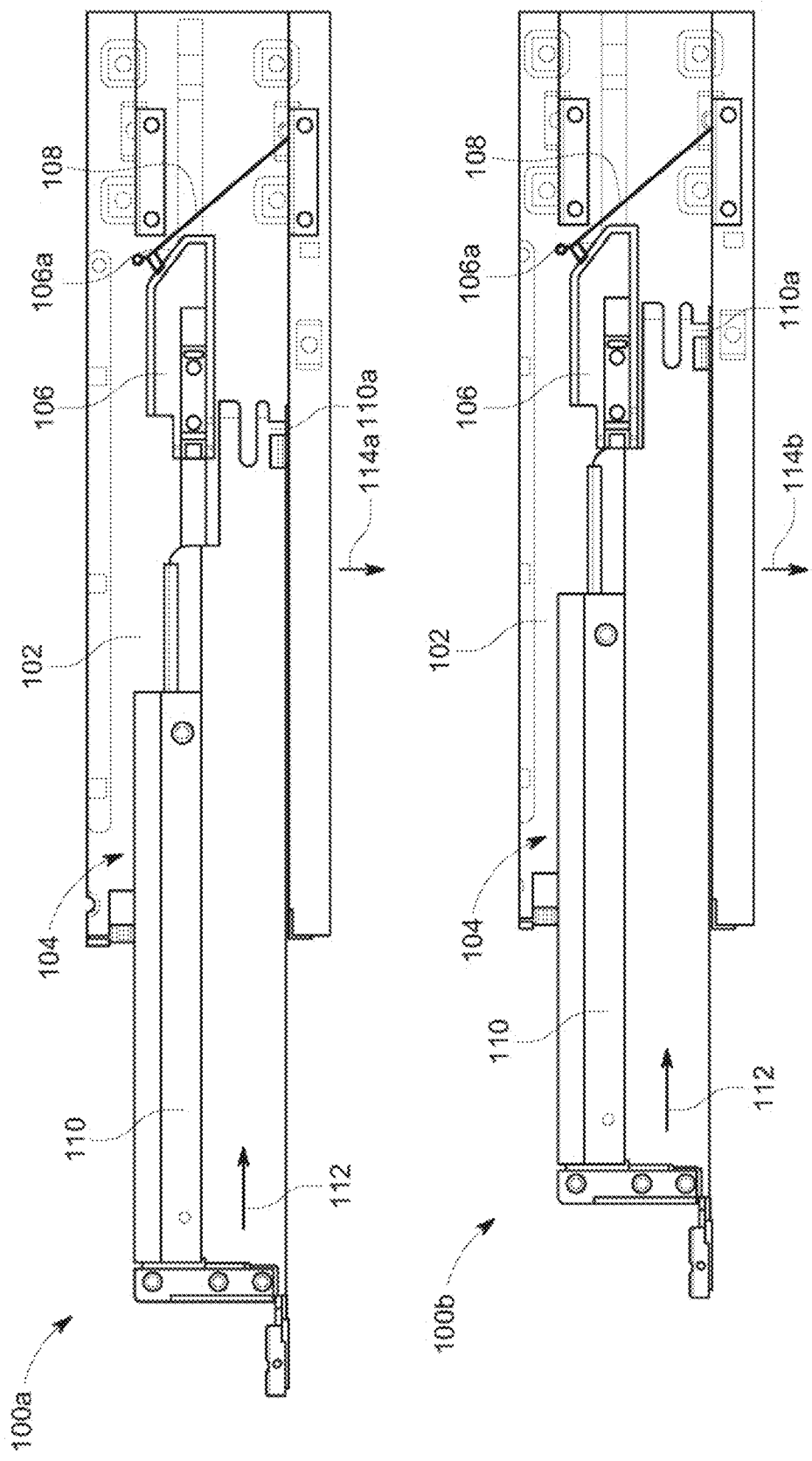
FIG. 1 is a side view depicting stages of a module being inserted into a slot of a chassis, according to aspects of the present disclosure.
Figure 1:
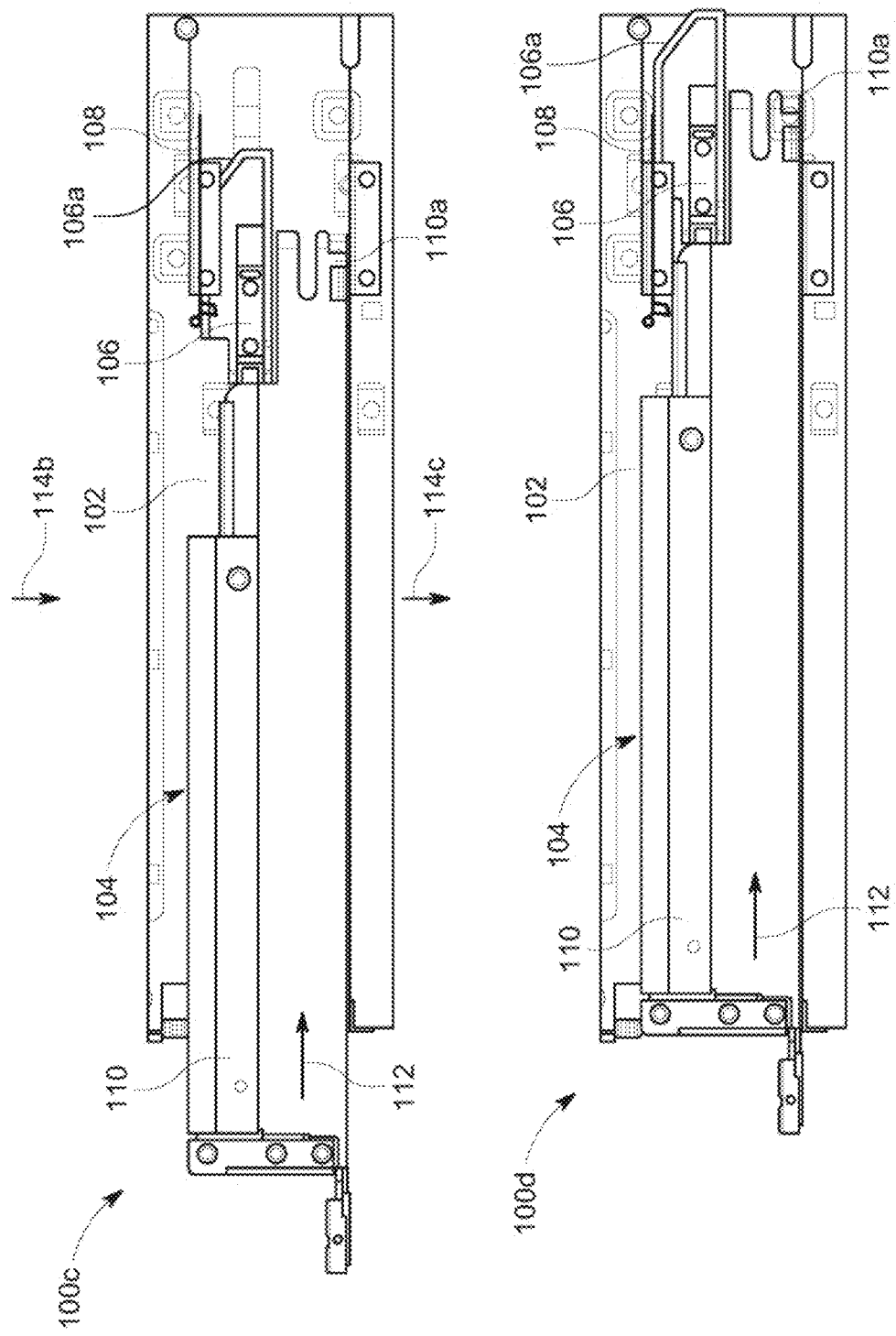

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" or "computer" refer to any electronically-powered or battery-powered equipment that has hardware, software, and/or firmware components, where the software and/or firmware components can be configured for operating features on the device.

Referring to FIG. 1, side views depict stages 100a-100d of a module 110 being inserted into a slot 104 of a chassis 102, according to aspects of the present disclosure. Specifically, depicted is a chassis 102 with a slot 104. The slot 104 includes a push rod 106. The push rod 106 is configured to translate the along the slot 104 in the direction of arrow 112.

The slot 104 also includes a flap 108. The flap 108 is configured to move between at least two positions. One position is a closed flap position. The closed flap position restricts or reduces airflow from escaping or entering the chassis through the slot 104. The open flap position allows the insertion of a component (e.g., module 110 discussed below) into the slot 104. The open flap position can alternatively, or in addition, provide airflow to the component once inserted into the slot 104, without the necessarily requiring the module to contact the flap 108.

The slot 104 is configured to accept the module 110. Although the module 110 illustrated in FIG. 1 is an empty sled, the module 110 can be any type of module that can be inserted into a slot of a chassis, including or excluding a sled. For example, the chassis 102 can be a chassis of a computer, such as a blade server, and the module 110 can be any type of module that can be inserted into the chassis of the computer, such as a blade server module (e.g., a hot-swappable blade server module).

Referring to stage 100a of FIG. 1, the module 110 is beginning to be inserted into the slot 104 of the chassis 102 in the direction of arrow 112. In stage 100a, the flap 108 is in the closed flap position, which restricts or reduces airflow from entering or escaping through the slot 104. The module 110 has not yet made contact with the push rod 106. Prior to the module 110 contacting the push rod 106, the push rod 106 is considered to be in a first push rod position, with the flap 108 in the closed flap position. As the module 110 continues into the slot 104, stage 100a advances to stage 100b, as depicted by arrow 114a.

Referring to stage 100b of FIG. 1, as the module 110 continues into the slot 104 in the direction of arrow 112, the module 110 contacts the push rod 106. Depending on the location of the push rod 106 relative to the flap 108, the module 110 further advancing into the slot 104 brings the push rod 106 into contact with the flap 108 (if the push rod 106 is not already contacting the flap 108). Once the push rod 106 contacts the flap 108, stage 100b advances to stage 100c, as depicted by arrow 114b.

Referring to stage 100c of FIG. 1, as the module 110 continues into the slot 104 in the direction of arrow 112, the module 110 translate the push rod 106 in the direction of arrow 112, which causes the flap 108 to move from the closed flap position of stages 100a and 100b, to the open flap position of stage 100c.

In one or more embodiments, the push rod 106 can have a surface 106a configured to assist in moving the flap 108 from the closed flap position to the open flap position. For example, and as illustrated in FIG. 1, the surface 106a can be angled or curved relative to a flat front of the push rod 106 so as to provide a larger contact surface between the push rod 106 and the flap 108. The larger contact surface can spread the force applied to the flap 108 from the push rod 106 to a larger surface area of the flap 108. The surface 106a can also be curved to provide for a consistent application for force against the flap 108 as the flap 108 moves from the closed flap position to the open flap position. The length of the push rod 106 can be long enough to contact the flap 108 before the module 110. In one or more embodiments, the surface 106a of the push rod 106 is angled or curved relative to a flat front so that the contact point between the push rod 106 and the flap 108 is as far away from the pivot point of the flap 108. This arrangement provides for a larger fulcrum advantage between the push rod 106 and the flap 108.

As the module 110 continues into the slot 104, the push rod 106 continues moving the flap 108 from the closed clap position to the open flap position. Once in the flap 108 is in the open flap position, stage 100c advances to stage 100d, as depicted by arrow 114c.

Referring to stage 100d of FIG. 1, with the flap 108 in the open flap position, the module 110 can be fully inserted within the slot 104. Further, the push rod 106 keeps the flap 108 in the open flap position. The push rod 106 contacting the flap 108 with the flap 108 in the open flap position can correspond to a second push rod position of the push rod 106.

With the distal end 110a of the module 110 past the flap 108 in the open flap position, the distal end 110a of the module 110 can access airflow within the chassis 102 for cooling one or more components of the module 110, among other various functions.

In one or more embodiments, the depth that the module 110 extends into the slot 104 may be insufficient for contacting the flap 108 with the module 110. In these cases, the push rod 106 further provides an extension to the module 110 for causing the flap 108 to move from the closed flap position to the open flap position. Therefore, even if the length of the module 110 is insufficient for the distal end 110a of the module to extend beyond the flap 108, or even contact the flap 108 to cause the flap 108 to move to the open flap position, the presence of the push rod 106 can causes the flap 108 to open.

Figure 2:
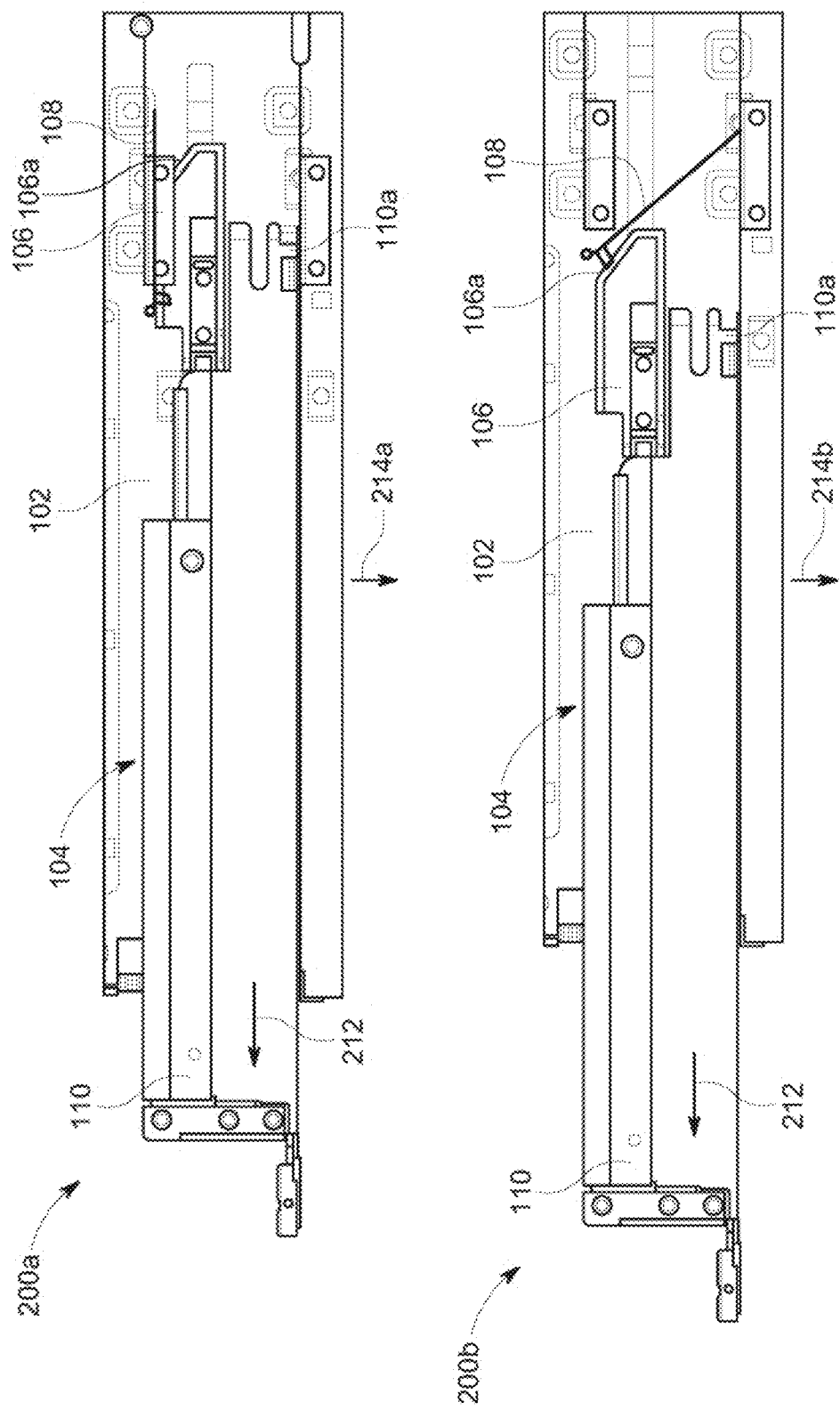
FIG. 2 is a side view depicting stages of a module being withdrawn from a slot of a chassis, according to aspects of the present disclosure.
Figure 2:
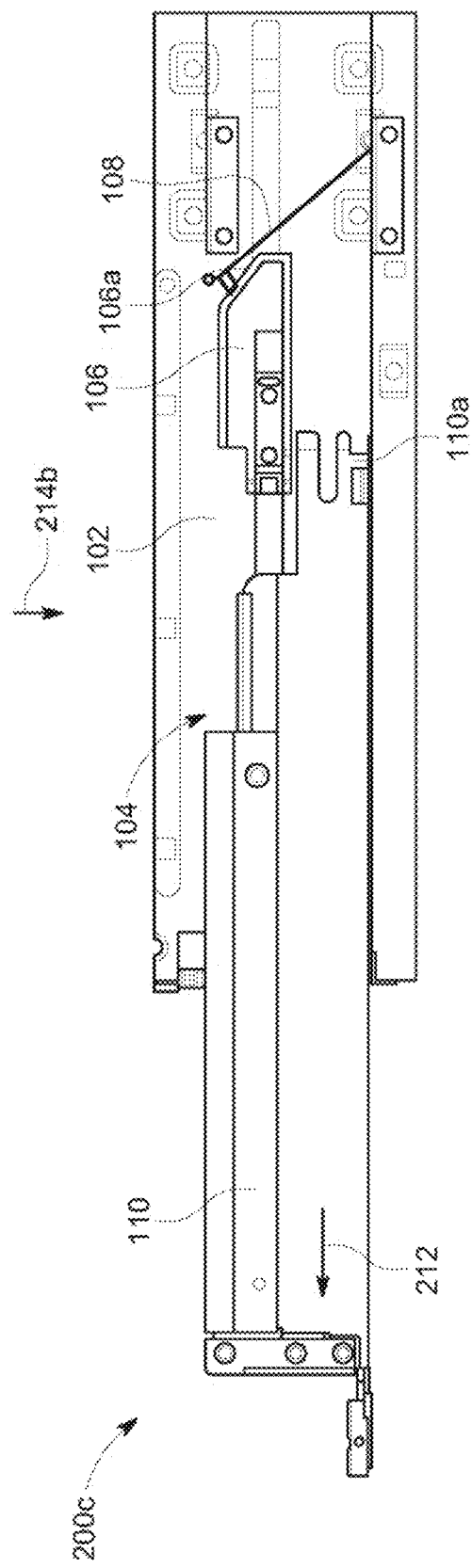

Referring to FIG. 2, side views depict stages 200a-200c of a module being withdrawn from a slot of a chassis, according to aspects of the present disclosure. For purposes of convenience, similar numbers used in FIG. 1 are reproduced in FIG. 2 for similar features. However, one or more features in FIG. 2 can vary from what is depicted and described in FIG. 1 without departing from the spirit and scope of the present disclosure.

Stage 200a in FIG. 2 begins with stage 100d in FIG. 1, with the module 110 fully inserted into the slot 104 and the push rod 106 keeping the flap 108 in the open flap position. From the fully inserted position of stage 200a, the module 110 begins to be withdrawn from the slot 104 in the direction of arrow 212, and stage 200a advances to stage 200b, as depicted by arrow 214a.

Referring to stage 200b of FIG. 2, further withdrawal of the module 110 from the slot 104 in the direction of arrow 212 reduces the force applied against the push rod 106 by the module 110. The reduction in the force allows the push rod 106 to translate in the direction of arrow 212. In one or more embodiments, the translation can be caused by, for example, one or more springs (not shown) connected to the chassis 102 at one end and to the push rod 106 at the other end. In one or more embodiments, the flap 108 can include one or more springs (not shown) that urge the flap 108 back to the closed flap position. With the withdrawal of the module 110 from against the push rod 106, the one or more springs urging the flap 108 back to the closed flap position can translate the push rod 106 in the direction of the arrow 212. In one or more embodiments, the surface 106a of the push rod 106 can be configured to assist the application of force by the flap 108 on the push rod 106, urging the push rod 106 in the direction of arrow 212.

Whatever the operation is that translates the push rod 106 in the direction of arrow 212 with the withdrawal of the module 110, the flap 108 is allowed to move back to the closed flap position in stage 200b. With the continued withdrawal of the module 110 in the direction of arrow 212, stage 200b advances to stage 200c, as depicted by arrow 214b.

Referring to stage 200c in FIG. 2, the module 110 continues to be withdrawn from the slot 104 in the direction of arrow 212. With the flap 108 back to the closed flap position, the push rod 106 can be configured to stop translating in the direction of arrow 212. The flap 108 in the closed position again restricts or reduces airflow from entering or escaping the slot 104. The module 110 can subsequently be fully withdrawn from the slot 104, and the process depicted in FIG. 2 is completed.

In one or more embodiments, the push rod 106 and the flap 108 may interfere with each other and prevent the flap 108 from moving to the closed flap position after withdrawal of the module 110. In one or more embodiments, a latch can be added to the system to mechanically withdraw the push rod 106 with the withdrawal of the module 110, as further described below.

Figure 3A:
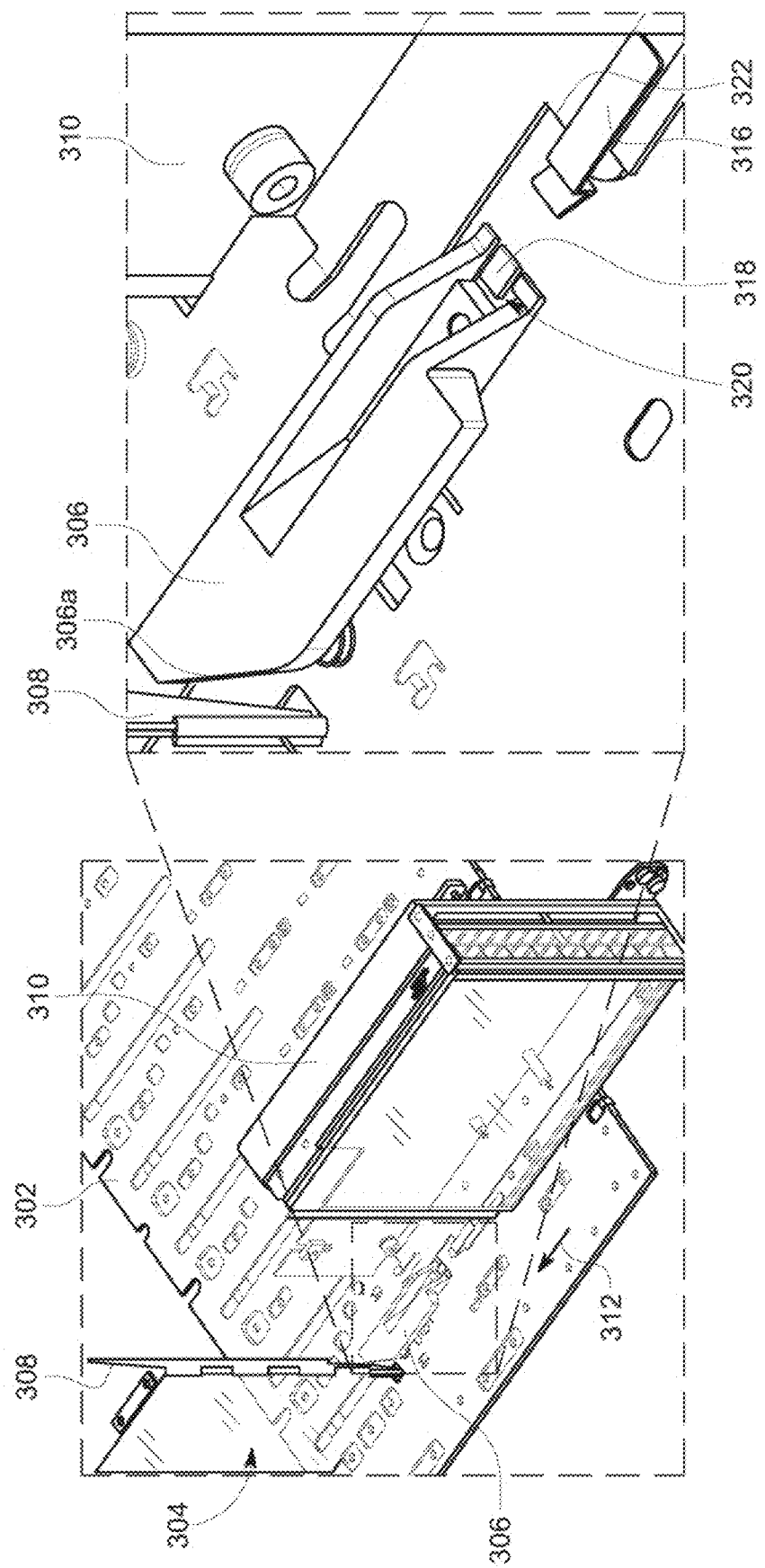
FIG. 3A is a perspective view depicting a module being inserted into a slot of a chassis, according to aspects of the present disclosure.
Figure 3B:
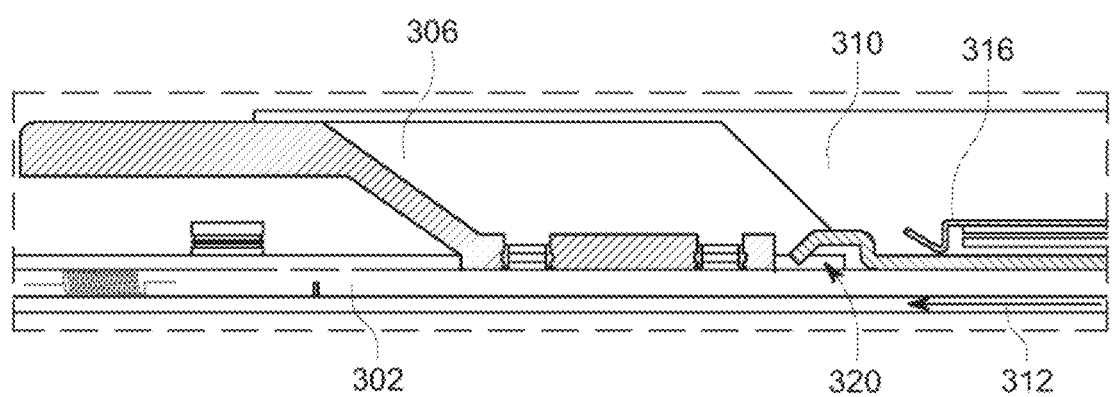
FIG. 3B is a side view of the module being inserted into the slot of the chassis in FIG. 3A, according to aspects of the present disclosure.

Referring to FIGS. 3A and 3B, a perspective view and a side view, respectively, depict a module 310 being inserted into a slot 304 of a chassis 302, according to aspects of the present disclosure. As depicted in FIG. 3A, the slot 304 includes a push rod 306 and a flap 308. The chassis 302, the slot 304, the push rod 306, the surface 306a of the push rod 306, the flap 308, and the module 310 can be similar to the same elements described above. Thus, for purposes of convenience, descriptions of these elements are the same as the descriptions above, except for any explicit differences provided below.

Similar to the description above for FIG. 1, FIG. 3A illustrates the module 310 being inserted within the slot 304 of the chassis 302 in the direction of arrow 312. As depicted in the detailed portion of FIG. 3A, and also in FIG. 3B, the module 310 includes a latch 316. In one or more embodiments, the latch 316 can be a leaf spring. As the module 310 translates towards the push rod 306 along the slot 304 in the direction of arrow 312, the latch 316 also translates towards the push rod 306.

Figure 4A:
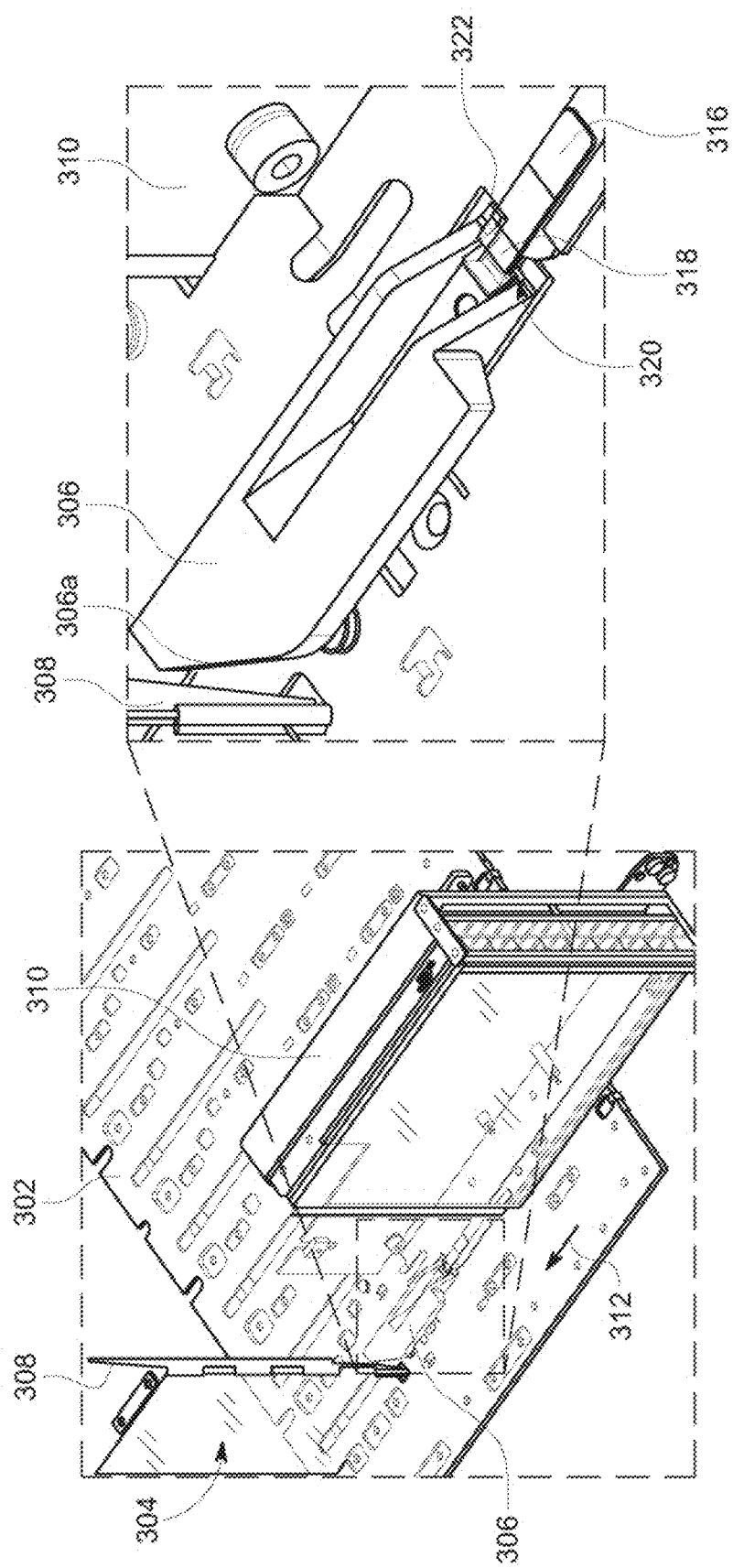
FIG. 4A is another perspective view depicting a module being inserted into a slot of a chassis, according to aspects of the present disclosure.
Figure 4B:
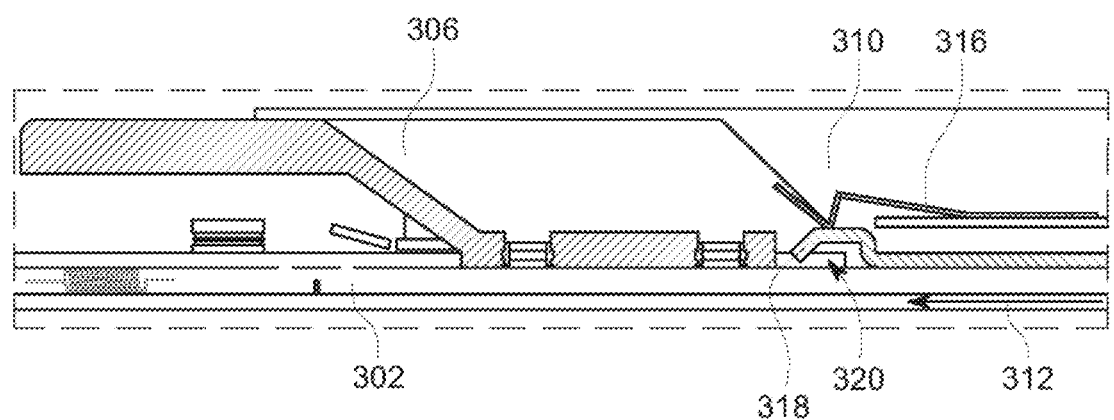
FIG. 4B is a side view of the module being inserted into the slot of the chassis in FIG. 4A, according to aspects of the present disclosure.

Referring to FIGS. 4A and 4B, a perspective view and a side view, respectively, depict the module 310 being further inserted into the slot 304 of the chassis 302, according to aspects of the present disclosure. More specifically, as the module 310 and the latch 316 approach the push rod 306, the latch 316 overrides a raised portion 318 of the chassis 302. The raised portion 318 can be integral with the chassis 302 or a feature that is connected to the chassis 302. In one or more embodiments, the raised portion 318 can be a curved step that helps the latch 316 override the raised portion 318. As the module 310 and the latch 316 continue translating in the slot 304 in the direction of arrow 312, the latch 316—now elevated by the raised portion 318—advances towards the push rod 306.

Figure 5A:
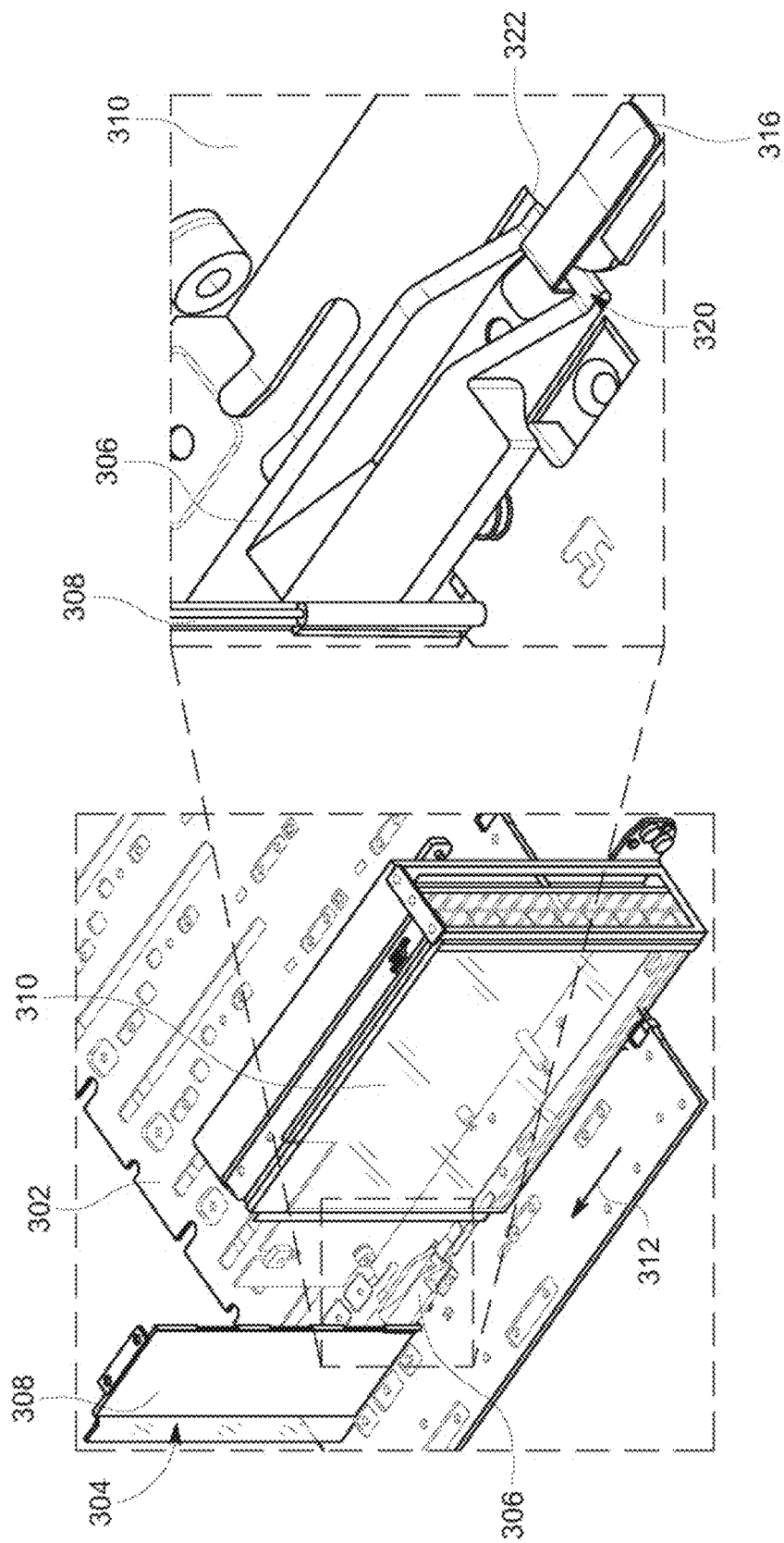
FIG. 5A is another perspective view depicting a module being inserted into a slot of a chassis, according to aspects of the present disclosure.
Figure 5B:
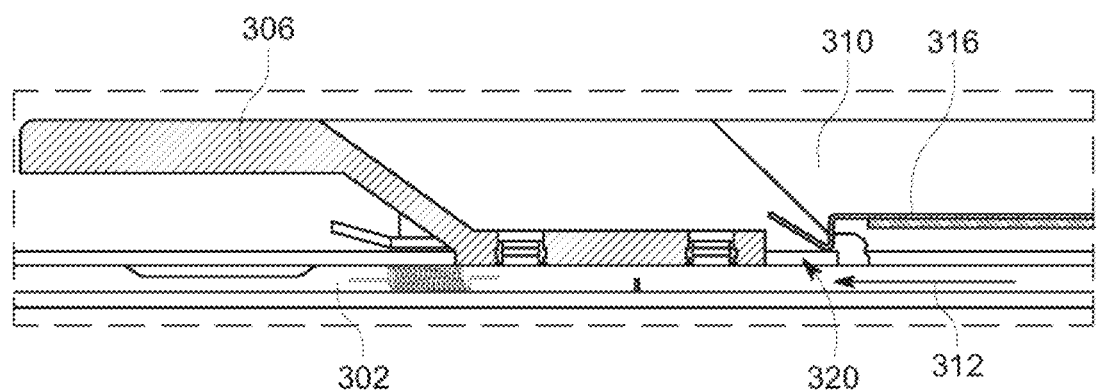
FIG. 5B is a side view of the module being inserted into the slot of the chassis in FIG. 5A, according to aspects of the present disclosure.

Referring to FIGS. 5A and 5B, a perspective view and a side view, respectively, depict the module 310 being further inserted into the slot 304 of the chassis 302, according to aspects of the present disclosure. More specifically, after the latch 316 fully overrides the raised portion 318, the latch 316 drops down into a notch 320 within the push rod 306. The latch 316 within the notch 320 engages the latch 316 with the push rod 306. The push rod 306 also is engaged with the module 310, via the latch 316.

Referring to FIG. 5A, with the latch 316 engaged to the push rod 306 via the notch 320, the module 310 continues advancing into the slot 304. The push rod 306 then translates within the slot 304 towards the flap 308 in the direction of arrow 312. In one or more embodiments, solely the latch 316 engaged with the notch 320 of the push rod 306 can cause the push rod 306 to translate in the direction of the arrow 312. Alternatively, or in addition, an edge 322 of the module 310 can contact the push rod 306. For example, the edge 322 of the module 310 can further assist in translating the push rod 306 towards the flap 308 in the direction of the arrow 312.

Similar to the discussion above for FIG. 1, the push rod 306 then causes the flap 308 to move from the closed flap positon to the open flap position. With the flap 308 in the open flap position, the module 310 can be fully inserted into the slot 304.

Figure 6A:
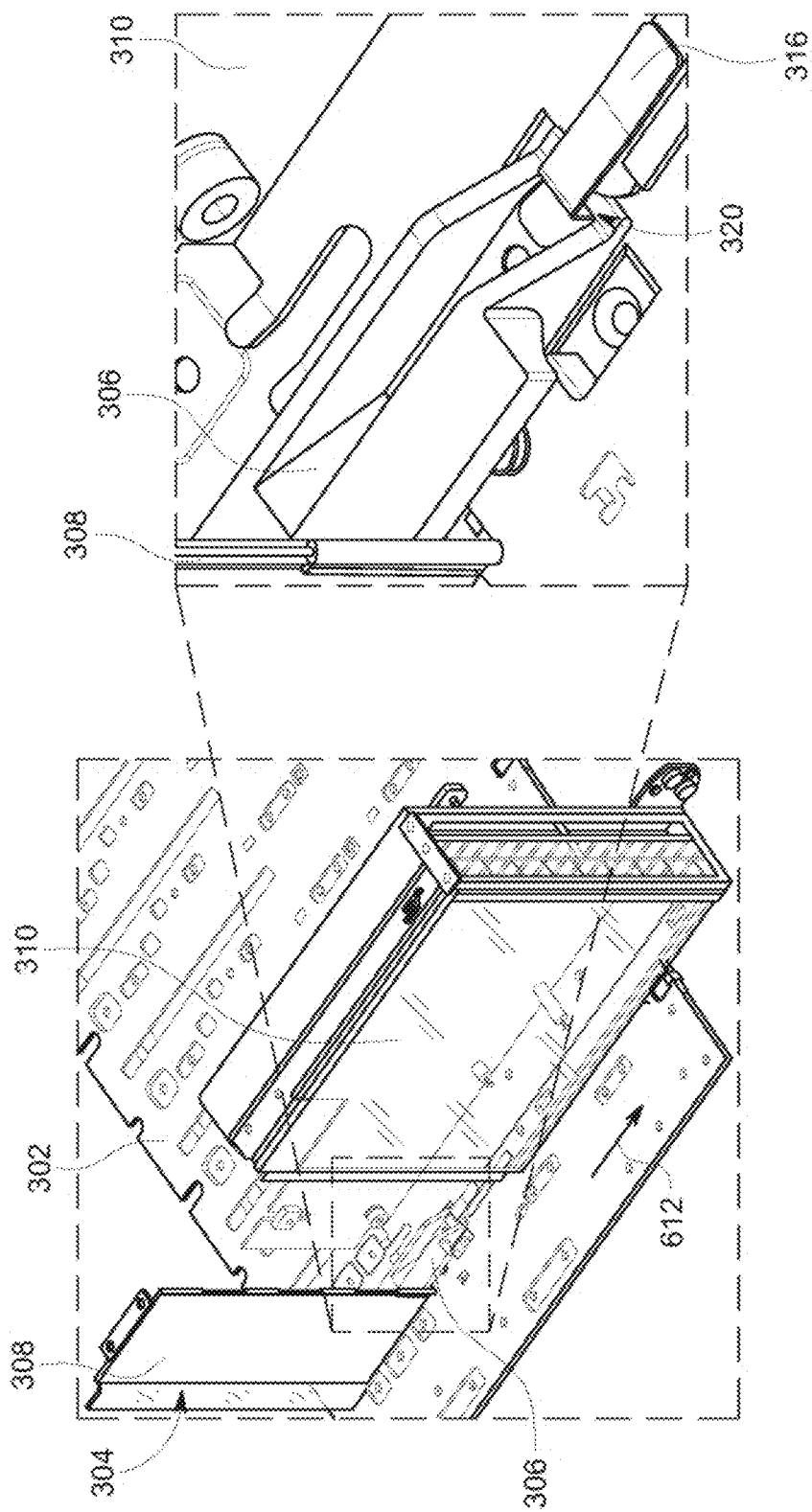
FIG. 6A is a perspective view depicting a module being withdrawn from a slot of a chassis, according to aspects of the present disclosure.
Figure 6B:
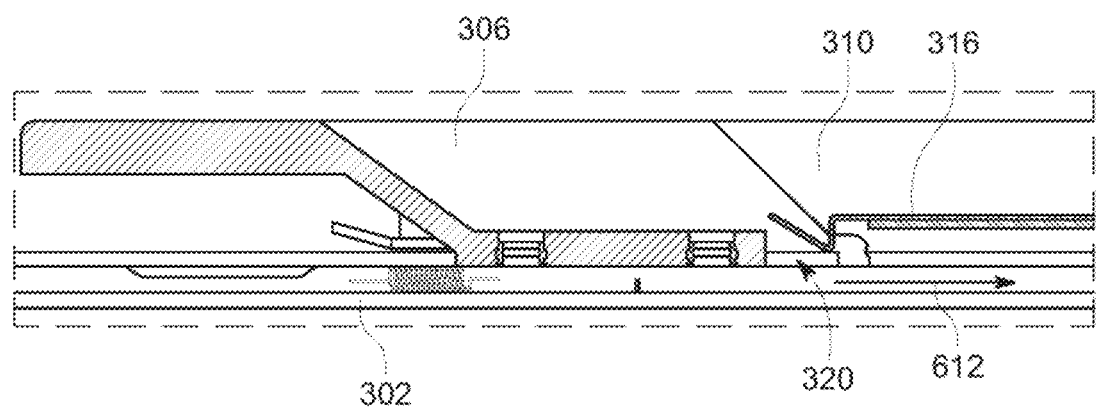
FIG. 6B is a side view of the module being withdrawn from the slot of the chassis in FIG. 6A, according to aspects of the present disclosure.

Referring to FIGS. 6A and 6B, a perspective view and a side view, respectively, depict the module 310 being withdrawn from the slot 304 of the chassis 302, according to aspects of the present disclosure. The module 310 can be withdrawn from the slot 304 by translating within the slot in the direction of arrow 612. Because the latch 316 is engaged with the notch 320 of the push rod 306, withdrawal of the module 310 connected to the latch 316 causes the latch 316 to translate the push rod 306 in the direction of the arrow 612. Thus, the latch 316 mechanically retracts the push rod 306 with the latch 316 and module 310. In one or more embodiments, one or more of the springs discussed above with respect to the push rod 306 and the flap 308 can be present or omitted.

Figure 7A:
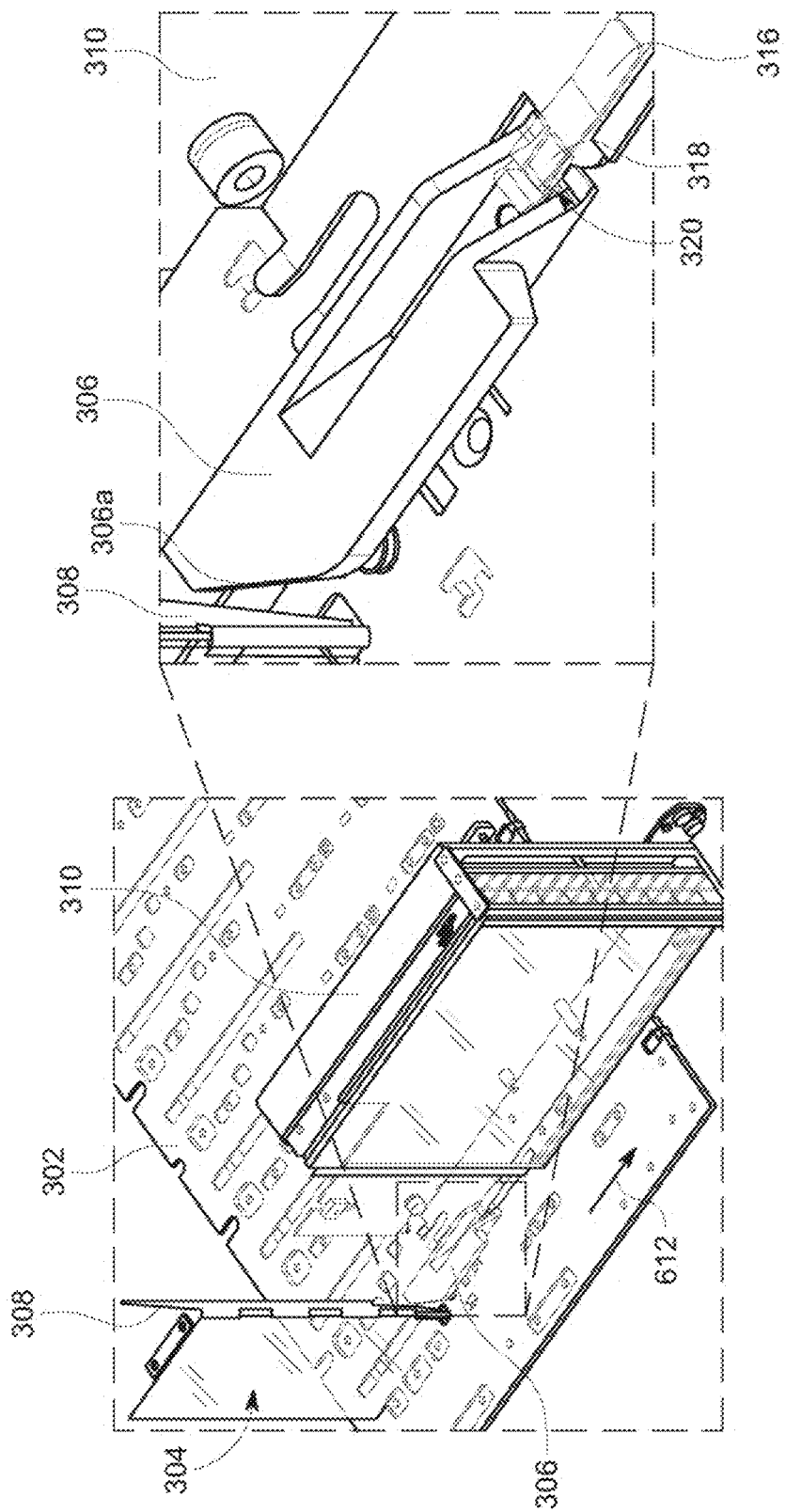
FIG. 7A is another perspective view depicting a module being withdrawn from a slot of a chassis, according to aspects of the present disclosure.
Figure 7B:
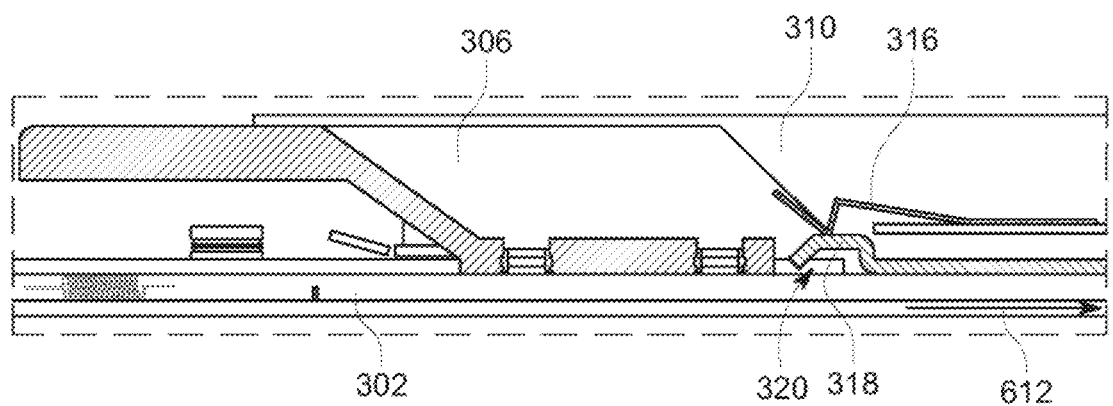
FIG. 7B is a side view of the module being withdrawn from the slot of the chassis in FIG. 7A, according to aspects of the present disclosure.

Referring to FIGS. 7A and 7B, a perspective view and a side view, respectively, depict the module 310 being further withdrawn from the slot 304 of the chassis 302. More specifically, as the module 310 translates within the slot 304 in the direction of the arrow 612, the latch 316 continues to cause the push rod 306 to translate in the same direction. This causes the push rod 306 to withdraw from contacting the flap 308. The removal of contact allows the flap 308 to move from the open flap position to the closed flap position.

Once the flap 308 is in the closed position, the latch 316 again overrides the raised portion 318, but now while translating in the direction of arrow 612. The latch 316 overriding the raised portion 318 causes the latch 316 to disengage from the notch 320 in the push rod 306. This releases the push rod 306 from the latch 316 and the module 310.

Figure 8A:
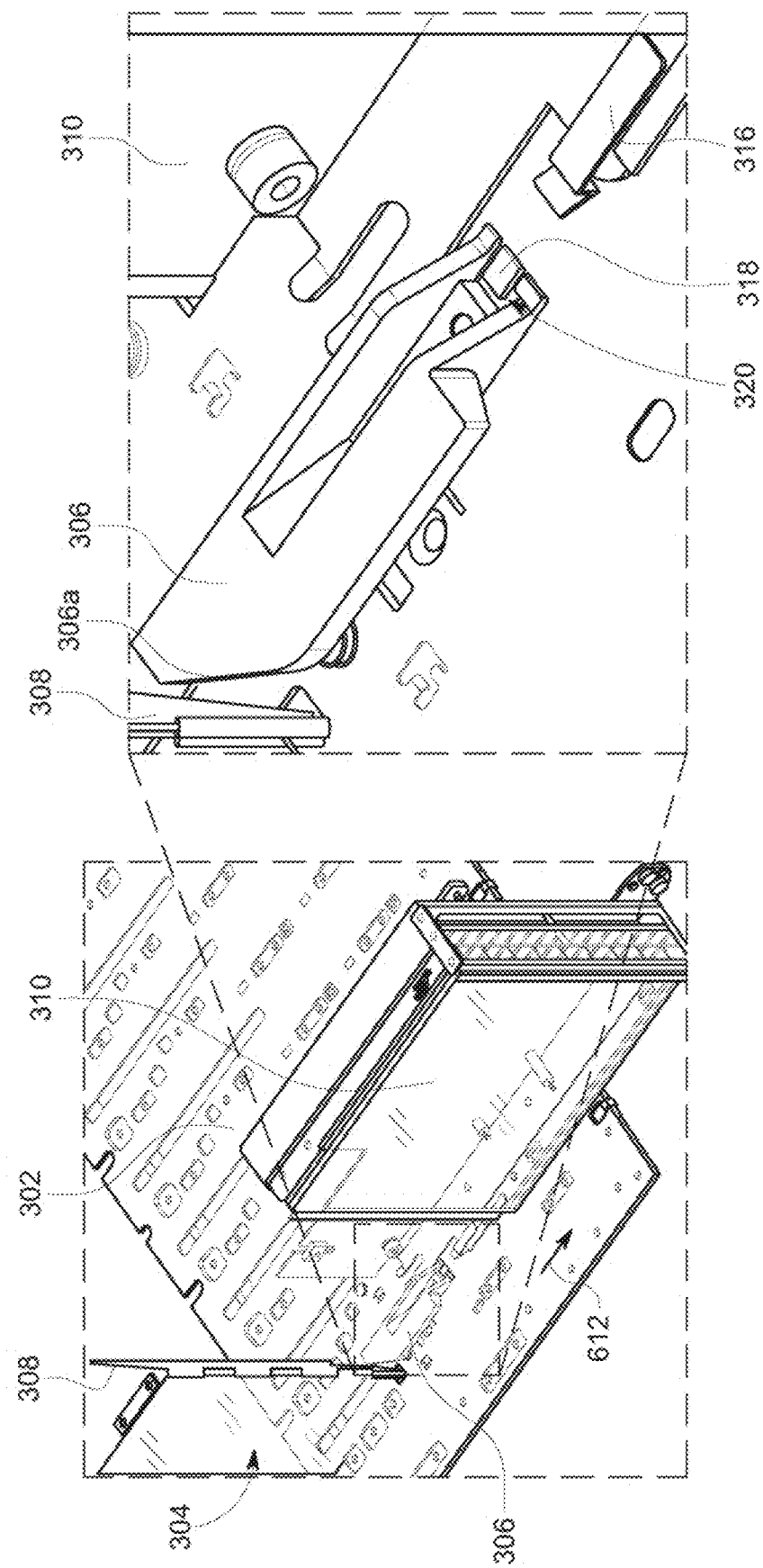
FIG. 8A is another perspective view depicting a module being withdrawn from a slot of a chassis, according to aspects of the present disclosure.
Figure 8B:
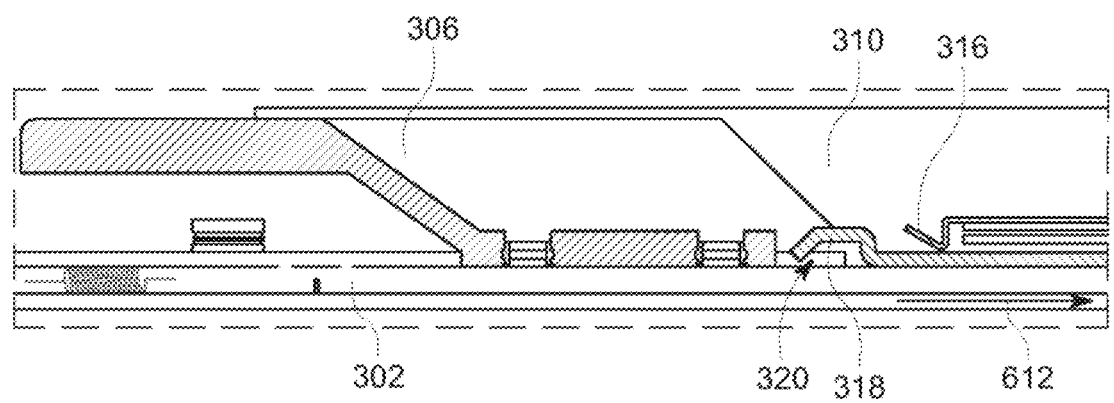
FIG. 8B is a side view of the module being withdrawn from the slot of the chassis in FIG. 8A, according to aspects of the present disclosure.

Referring to FIGS. 8A and 8B, a perspective view and a side view, respectively, depict the module 310 being further withdrawn from the slot 304 of the chassis 302, according to aspects of the present disclosure. More specifically, the latch 316 can fully override the raised portion 318 and return to a normal position, as depicted in FIG. 8B. Accordingly, the presence of the latch 316 can assist in the withdrawal of the push rod 306, which can help prevent the push rod 306 from interfering with the flap 308, preventing the flap 308 from closing after the withdrawal of the module.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A system comprising:
    a chassis having a slot configured to receive a module;
    a flap within the slot, the flap being configured to be in at least a first flap position and a second flap position;
    a push rod configured to translate within the slot, the push rod further being configured in a first push rod position to allow the flap to move to the first flap position, the push rod further being configured in a second push rod position to move the flap into the second flap position; and a latch configured to translate within the slot, the latch further being configured to engage the push rod to travel in a first direction with the push rod from the first push rod position to the second push rod position, the latch further being configured to withdraw the push rod from the second push rod position in a second direction, opposite from the first direction, wherein the push rod is configured to translate within the slot between the first push rod position and the second push rod position based, at least in part, on withdrawal and insertion of the module within the slot respectively, the flap in the second flap position is configured to allow full insertion of the module within the slot, and the flap in the first flap position reduces airflow from entering or escaping the slot.

2. The system of claim 1, wherein the push rod is configured to translate within the slot between the first push rod position and the second push rod position based, at least in part, on the latch translating in response to the withdrawal and insertion of the module within the slot.

3. The system of claim 1, further comprising:
a notch in the push rod,
wherein the latch is configured to engage the push rod by engaging the notch.

4. The system of claim 3, further comprising:
a raised portion within the slot,
wherein the latch is configured to engage the notch of the push rod by overriding the raised portion in the slot as the latch translates in the first direction.

5. The system of claim 1, further comprising:
a raised portion within the slot,
wherein the latch is configured to disengage from the push rod by overriding the raised portion in the slot as the latch withdraws the push rod in the second direction.

6. The system of claim 1, wherein the latch is connected to the module.

7. The system of claim 6, wherein the latch is a leaf spring.

8. The system of claim 1, wherein the push rod is connected to the chassis.

9. The system of claim 1, wherein the chassis is a blade server chassis, and the blade server has a plurality of the slot.

10. The system of claim 9, wherein the module is a blade server module.

11. A method comprising:
beginning to withdraw a module from within a slot of a chassis in a first direction;
translating a latch within the slot in the first direction with the beginning of the withdrawal of the module from the slot;
translating a push rod engaged with the latch in the first direction with the translating of the latch, the translating of the push rod allowing a flap within the slot to begin moving from an open flap position to a closed flap position; and
advancing the latch over a raised portion within the slot causing the latch to disengage from the push rod with the flap substantially in the closed flap position,
wherein the flap in the closed flap position reduces airflow from entering or escaping the slot, and the flap in the open flap position is configured to allow full insertion of the module within the slot.

12. The method of claim 11, wherein the raised portion is formed in the chassis.

13. The method of claim 11, wherein the chassis is a blade server chassis, and the blade server has a plurality of the slot.

14. The method of claim 11, wherein the latch is connected to the module, and the push rod is connected to the chassis.

15. A method comprising:
inserting a module within a slot of a chassis in a first direction;
translating a latch in the slot in the first direction with the inserting of the module;
overriding a portion of a push rod with the latch, causing the latch to engage a notch in the push rod; and
translating the push rod with the latch and the module within the slot in the first direction causing the push rod to move a flap within the slot from a closed flap position to an open flap position, allowing the module to be fully inserted in the slot,
wherein the flap in the open flap position is configured to allow full insertion of the module within the slot, and the flap in the closed flap position reduces airflow from entering or escaping the slot.

16. The method of claim 15, wherein the latch is a leaf spring.

* * * * *